United States Patent
Kamiguchi et al.

[11] Patent Number: 6,043,515
[45] Date of Patent: Mar. 28, 2000

[54] OPTICAL SEMICONDUCTOR DEVICE

[75] Inventors: Yuzo Kamiguchi; Yuzo Hirayama; Masashi Sahashi, all of Yokohama, Japan

[73] Assignee: Kabushiki Kaisha Toshiba, Kawasaki, Japan

[21] Appl. No.: 08/931,523

[22] Filed: Sep. 16, 1997

[30] Foreign Application Priority Data

Sep. 17, 1996 [JP] Japan .................................. 8-245295
Mar. 18, 1997 [JP] Japan .................................. 9-064288

[51] Int. Cl.[7] .............................. H01L 33/00; H01S 3/19; H01S 3/091
[52] U.S. Cl. .............................. 257/103; 257/81; 257/97; 257/99; 372/43; 372/70; 372/75; 372/106
[58] Field of Search .................................. 257/13, 81, 97, 257/99, 103; 372/43, 70, 75, 106

[56] References Cited

U.S. PATENT DOCUMENTS

| | | | |
|---|---|---|---|
| 5,287,377 | 2/1994 | Fukuzawa | 372/75 |
| 5,513,204 | 4/1996 | Jayaraman | 372/75 |
| 5,698,863 | 12/1997 | Pelekanos | 257/13 |
| 5,793,054 | 8/1998 | Nido | 257/103 |

FOREIGN PATENT DOCUMENTS

WO 95/00975  1/1995  WIPO.

Primary Examiner—Jerome Jackson, Jr.
Attorney, Agent, or Firm—Oblon, Spivak, McClelland, Maier & Neustadt, P.C.

[57] ABSTRACT

An optical semiconductor device has a structure in which a semiconductor active layer is sandwiched by a p-type semiconductor cladding layer and an n-type semiconductor cladding layer and a p-type contact layer is formed on the p-type semiconductor cladding layer side and an n-type contact layer is formed on the n-type semiconductor cladding layer side, wherein two ferromagnetic layers are formed on the n-type contact layer and two ferromagnetic layers are formed on the p-type contact layer. Magnetization directions of a pair of ferromagnetic layers vertically opposed to each other are set to be parallel to each other, and the magnetization directions of adjacent ferromagnetic layers are inverted to each other.

5 Claims, 8 Drawing Sheets

OPTICAL SEMICONDUCTOR DEVICE

BACKGROUND OF THE INVENTION

The present invention relates to an optical semiconductor device.

Recently, optical semiconductor devices have been developed. However, these optical semiconductor devices have respective problems as shown in the following description.

For example, a blue light source has been vigorously developed to become the light source for a display and the next generation DVD. A GaN-based semiconductor has particularly attracted attention since its emission wavelength can be shortened to an ultraviolet ray. However, in this material system, the electron effective mass is large so that it is hard to cause population inversion. Accordingly, this material system has disadvantages in that a threshold value is essentially high in comparison with the conventional material system. Therefore, a blue laser is difficult to obtain for practical use.

A semiconductor laser using intersubband transition within a conduction band instead of interband transition conventionally utilized has attracted attention as a technique for improving performance of the semiconductor laser. However, in this element structure, a carrier relaxation is caused by LO phonons at a very high speed so that it is hard to cause population inversion. Therefore, an intersubband transition laser is difficult to obtain for practical use.

Various kinds of optical devices for processing information have been vigorously developed as an amount of transmitted information has increased. It is particularly important to develop an optical operational element such as a bistable element. However, a bistable element having excellent characteristics has not been realized yet.

In optical communication, a direct intensity modulation by a multimode optical fiber is mainly used. However, recently, coherent optical transmission using a single mode optical fiber has been vigorously researched. In coherent optical transmission, a frequency shift keying (FSK) or a phase shift keying (PSK) is applied instead of direct intensity modulation. It is known that among these modulation methods, PSK shows a most preferable S/N ratio. However, a switching speed of a magneto-optic element, a liquid crystal or an electro-optic element used in phase control of a laser beam is generally low. Therefore, it is difficult to have a wide band width practical communication system by using phase shift keying (PSK). It is necessary to obtain linearly polarized light or circularly polarized light at a high switching speed in order to have a practical sysytem.

Linearly polarized light and circularly polarized light are also used in the fields other than optical communication. For example, a method for investigating a spin state of a substance has been proposed, in which a scanning tunneling microscope (STM) having a GaAs probe is used and the GaAs probe is irradiated with circularly polarized light for pumping conduction electrons having a spin in a specific direction. Further, semiconductor devices utilizing spin polarized electrons have been proposed. A circularly polarized laser has attracted attention as a light source for spin-pumping in such semiconductors.

As mentioned above, the importance of a circularly polarized laser and a linearly polarized laser are increasing. However, polarized light is conventionally obtained by first generating an unpolarized laser beam and then passing the laser beam through a Pockels cell or a filter. Therefore, the construction of the device is large-sized. Further, when a polarizing direction is modulated, the device becomes complicated and large-sized. Accordingly, it was difficult to make the device compact and to reduce the cost of the device.

In contrast to this, an optical semiconductor device is proposed (international publication WO95/00975), in which a spin polarized electron is injected through a magnetic layer into a semiconductor layer forming a heterojunction and circularly polarized light is oscillated by recombination of spin polarized carries. In this optical semiconductor device, the circularly polarized light is modulated by magnetization inversion to the magnetic material caused unused by an external magnetic field. However, because the response of magnetization inversion by the external magnetic field in the magnetic material is not high it is hard to modulate the circularly polarized light at high speed. BRIEF SUMMARY OF THE INVENTION An object of the present invention is to provide a GaN-based semiconductor laser for obtaining laser oscillation at a low threshold value by enabling easy population inversion. Another object of the present invention is to provide an optical bistable element having excellent characteristics. A further object of the present invention is to provide a semiconductor laser having a simple construction which can be made compact and shows high speed switching characteristics of circularly polarized light applicable to optical communication by phase shift keying (PSK).

An optical semiconductor device of the present invention has a structure in which a semiconductor active layer is sandwiched by a p-type semiconductor cladding layer and an n-type semiconductor cladding layer, and a p-type contact layer is formed on the p-type semiconductor cladding layer side and an n-type contact layer is formed on the n-type semiconductor cladding layer side, wherein said semiconductor active layer is a strained quantum well layer including at least one GaN layer, and a ferromagnetic layer is formed on at least one of the contact layers. In this structure, a population inversion state of carriers is easily obtained and a GaN-based semiconductor laser having a low threshold value for laser oscillation can be realized.

Another optical semiconductor device of the present invention has an intersubband transition structure in which a semiconductor active layer is sandwiched by two semiconductor cladding layers having the same conductivity type, and contact layers are formed on either side of the two semiconductor cladding layers, wherein a ferromagnetic layer is formed on at least one of the contact layers. In this structure, a population inversion state of carriers is also easily obtained and an intersubband transition laser having a low threshold value for laser oscillation can be realized.

Another optical semiconductor device of the present invention has a structure in which a semiconductor active layer is sandwiched by two cladding layers and a resonator is formed, and also comprises means for irradiating said semiconductor active layer with circularly polarized pumping light. In this structure, an optical bistable element of high performance can be provided.

A further optical semiconductor device of the present invention has a structure in which a semiconductor active layer is sandwiched by a p-type semiconductor cladding layer and an n-type semiconductor cladding layer, and a p-type contact layer is formed on the p-type semiconductor cladding layer side and an n-type contact layer is formed on the n-type semiconductor cladding layer side, wherein two or more ferromagnetic layers are formed on the n-type contact layer, and two or more ferromagnetic layers are formed on the p-type contact layer. In this optical semiconductor device, it is preferable that two ferromagnetic layers are formed on the n-type contact layer and two ferromagnetic layers are formed on the p-type contact layer, and that magnetization directions of a pair of ferromagnetic layers vertically opposed to each other are parallel to each other, and magnetization directions of adjacent ferromagnetic layers are inverted to each other. In this structure, a semiconductor laser showing high speed circularly polarized light switching characteristics can be provided.

DETAILED DESCRIPTION OF THE INVENTION

The principle of an optical semiconductor device in the present invention will be described hereinafter.

A semiconductor laser including a GaN layer in accordance with the first embodiment of the present invention has a structure in which a semiconductor active layer is sandwiched by a p-type semiconductor cladding layer and an n-type semiconductor cladding layer, and a p-type contact layer is formed on the p-type semiconductor cladding layer side and an n-type contact layer is formed on the n-type semiconductor cladding layer, wherein a ferromagnetic layer is formed on at least one of the contact layers. In the present invention, the contact layer may be a semiconductor. Alternatively, the cladding layer may serve for the contact layer.

Figure 1A:
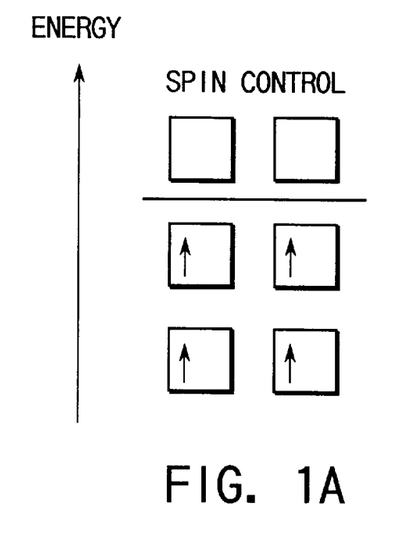
FIG. 1A is a view explaining the spin orientation of carriers injected into a semiconductor laser of the present invention.
Figure 1B:
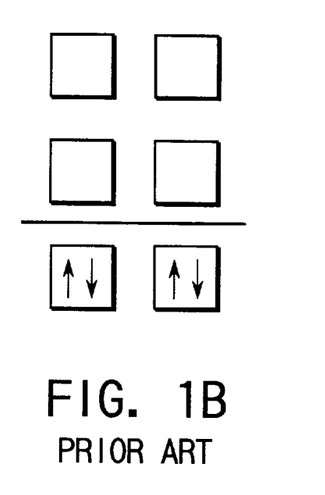
FIG. 1B is a view explaining the spin orientation of carriers injected into a conventional semiconductor laser.

If a ferromagnetic layer is formed on a semiconductor layer as mentioned above and carriers are injected into the semiconductor layer through the ferromagnetic layer, it is known that the spin orientations of the carriers are arranged in order. FIGS. 1A and 1B respectively show the spin orientations of the carriers injected into the spin-controlled semiconductor laser of the present invention and the conventional semiconductor laser.

As shown in FIG. 1B, the spin orientations of the injected carriers in the conventional semiconductor laser are random so that a pair of carriers of up-spin and down-spin occupy one state. In contrast to this, the spin orientations are arranged in order in the semiconductor laser of the present invention as shown in FIG. 1A so that the carriers occupy higher energy states in accordance with the Pauli exclusion principle. Therefore, Fermi level is easily changed. This applies to each of a conduction band and a valence band. However, population inversion is easily caused if a change in Fermi level of one of the conduction and valence bands is large. Accordingly, sufficient effects are obtained if the ferromagnetic layer is formed on either the p-type or n-type contact layer. For example, the ferromagnetic layer is formed on a cladding layer epitaxially grown on the active layer on a side opposed to a substrate.

Figure 2:
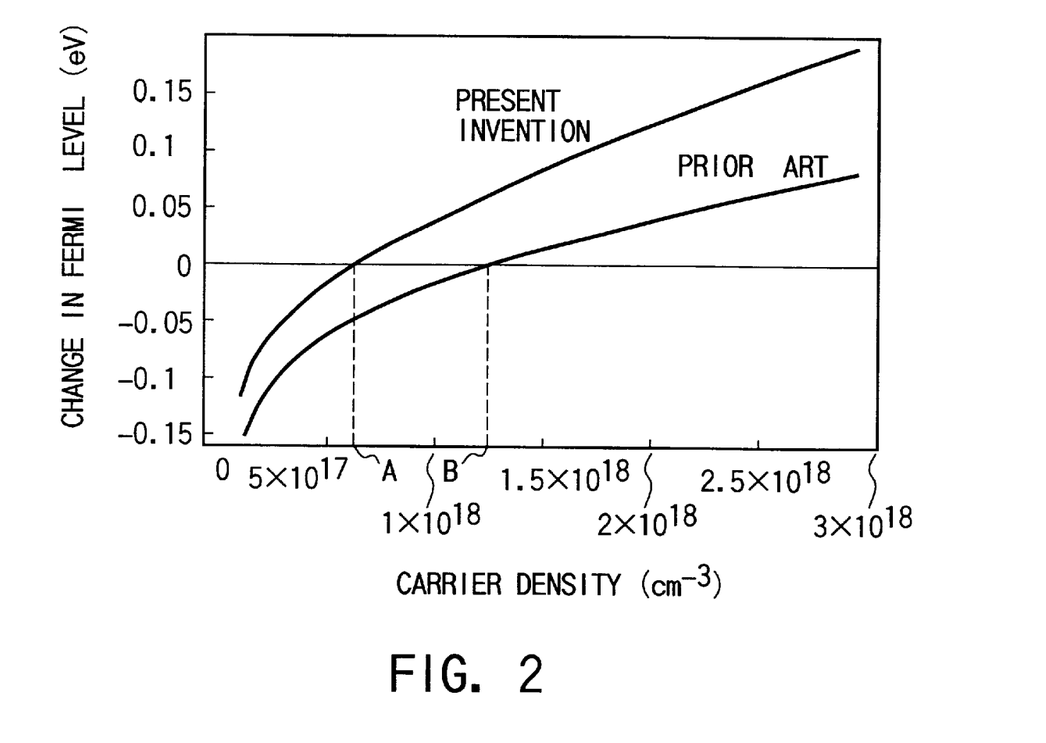
FIG. 2 is a graph showing a change in Fermi level versus an injected carrier density with respect to the semiconductor laser of the present invention and the conventional semiconductor laser.

FIG. 2 shows compared results of the conventional semiconductor device and the semiconductor device of the present invention with respect to easiness of the change in Fermi level versus injected carrier density. This graph is plotted such that oscillation is obtained at a carrier density where the ordinate value equals zero. It is known from FIG. 2 that in the present invention oscillation is caused at a carrier density half the conventional carrier density. Accordingly, a high performance semiconductor laser having a low oscillating threshold value is obtained by the construction of the present invention although the GaN-based semiconductor is used.

Emission from the semiconductor laser of the present invention normally includes a circularly polarized light component. However, a mode of propagation with TE linearly polarized light or TM linearly polarized light is stable in a slab type or a transversal rectangular type optical waveguide. Therefore, it is desirable to reduce the circularly polarized light component. Accordingly, it is effective to use a strained quantum well structure in the active layer in the present invention. Heavy hole emission is dominant in the normal active layer. In contrast to this, light hole emission becomes dominant in the active layer of the strained quantum well structure since strain is introduced. A TM linearly polarized light component is generally increased in the light hole emission. Further, perfect TM linearly polarized light is obtained when ferromagnetic layers are respectively formed on the contact layers on both sides of the active layer and spins of both electrons and holes are controlled. Therefore, the emitted light is stably propagated in the optical waveguide. Accordingly, oscillation can be caused at a further low threshold value.

The second embodiment of the present invention relates to an intersubband transition laser having an intersubband transition structure in which an active layer of a semiconductor quantum well structure is sandwiched by two semiconductor cladding layers having the same conductivity type and contact layers are formed on either side of the two semiconductor cladding layers, wherein a ferromagnetic layer is formed on at least one of the contact layers.

Figure 3:
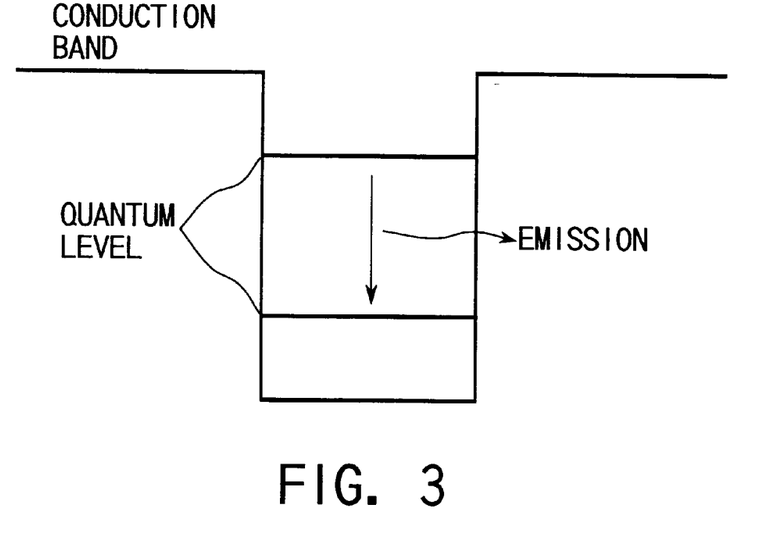
FIG. 3 is a view showing a band structure of an intersubband transition laser.

FIG. 3 is a view showing a band structure of the intersubband transition laser. As shown in FIG. 3, plural quantum levels are formed in a conduction band and carriers are injected into higher energy levels among these quantum levels. In the present invention, the spin orientations of the carriers injected into the semiconductor layers through the ferromagnetic layer are arranged in order and many carriers are accumulated at higher levels so that oscillation is easy to obtain. Therefore, a high performance intersubband transition semiconductor laser having a low oscillating threshold value is provided.

Emission from the semiconductor laser explained above is linearly polarized light or circularly polarized light. However, there is a case where an isotropic laser beam is desirable for use. In order to obtain the isotropic laser beam, it is preferable to form a ferromagnetic layer consisting of two or more regions magnetized antiparallel to each other. For example, a ferromagnetic layer may be formed on the conduct layer and may be magnetized to form several magnetic domains antiparallel to each other. Alternatively, two or more ferromagnetic layers may be formed on the contact layer and may be magnetized antiparallel to each other. At this time, it is desirable that a size of one magnetic domain or each of the ferromagnetic layers is set to be larger than the spin diffusion length.

Figure 4:
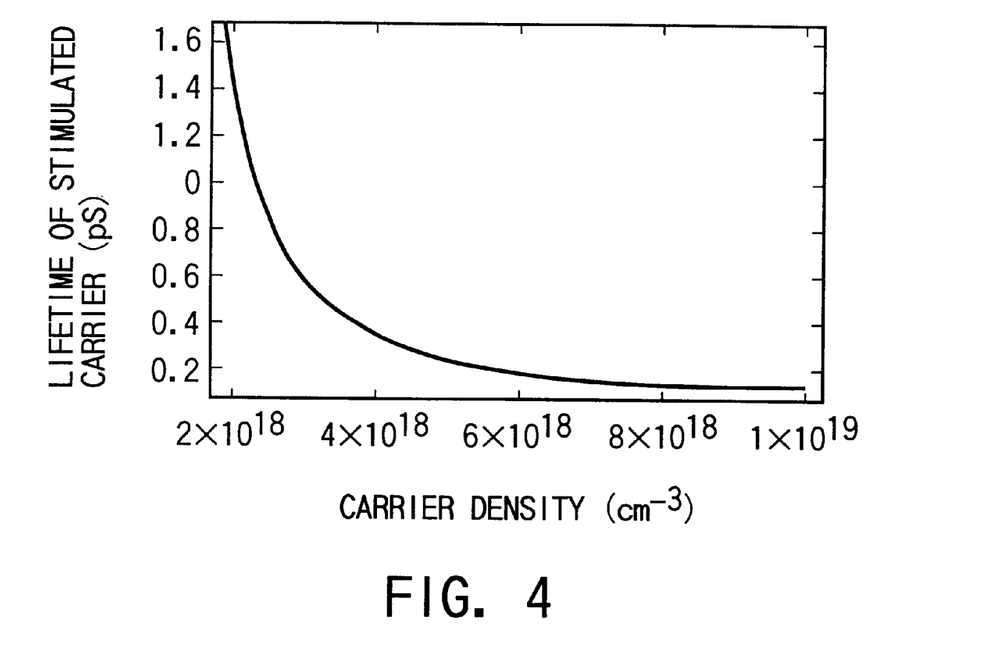
FIG. 4 is a graph showing the relationship between a carrier density and the lifetime of stimulated carriers.

The third embodiment of the present invention relates to an optical bistable element in which a semiconductor active layer is sandwiched by two cladding layers and a resonator is formed and further comprises means for irradiating the active layer with circularly polarized pumping light. In this embodiment, carriers having spin orientations arranged in order are injected in the form of circularly polarized light instead of electrical injection. FIG. 4 shows the relationship between an injected carrier density and the lifetime of stimulated carriers. As shown in this figure, the lifetime of the carriers is longer than a spin relaxation time in a state prior to oscillation at a low carrier density. Therefore, the spins of the injected carriers are rendered random. When excitation intensity is increased, the carrier density is increased so that oscillation is caused. As can be seen from FIG. 4, an effective lifetime of the carriers is equal to or shorter than a picosecond due to the effects of stimulated emission when the oscillation is first caused.

Figure 5A:
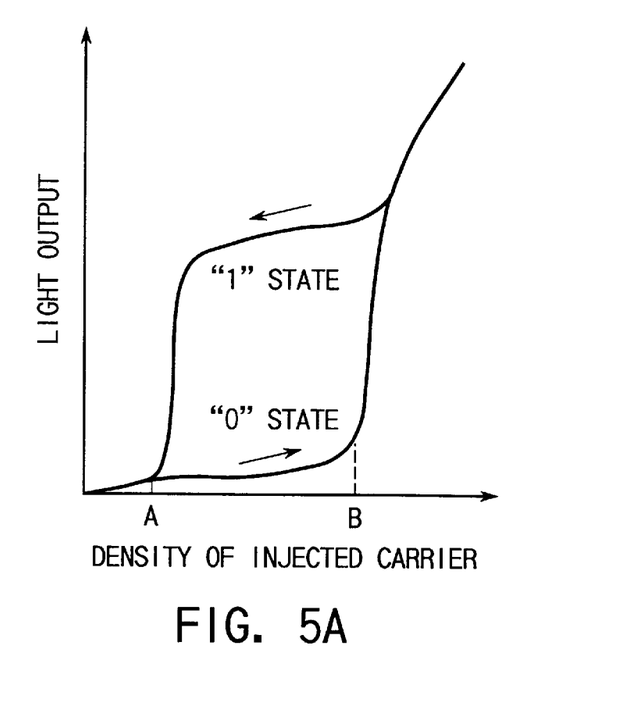
FIG. 5A is a graph showing the relationship between an injected carriers and a light output in an optical bistable element of the present invention.
Figure 5B:
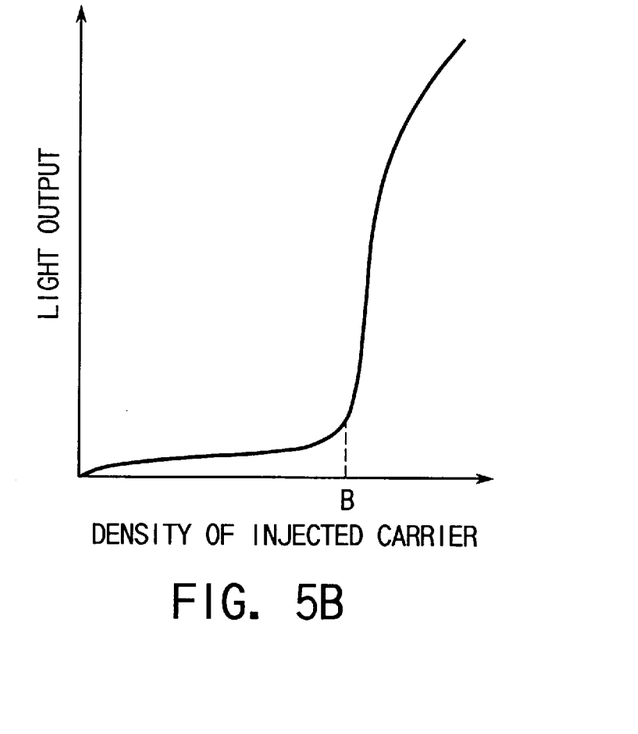
FIG. 5B is a graph showing the relation between an injected carriers and a light output in the conventional optical bistable element.

The present invention can provide an optical bistable element by the above-mentioned principle. FIG. 5A shows the relationship between the injected carrier density and a light output in the optical bistable element of the present invention. FIG. 5B shows the relationship between the injected carrier density and a light output in the conventional element. As shown in these figures, no oscillation is caused until the injected carrier density reaches a point B in each of the conventional element and the optical bistable element of the present invention. When the oscillation is first caused, the effective lifetime of carriers is shortened by stimulated emission. In the optical bistable element of the present invention, the effects of arranged spin orientations appear markedly even when the injected carriers are reduced. Therefore, the oscillation can be maintained if the injected carrier density is equal to or greater than at least a carrier density at a point A, thereby obtaining a high light output. Accordingly, an optical bistable state shown in FIG. 5A can be realized. Bistability can be also realized by current injection in the case of an element having a ferromagnetic layer in the present invention.

The principle of a semiconductor laser in accordance with the fourth embodiment of the present invention will be described in detail.

The band structure of a spin-up electron (spin $½$) is different from that of a spin-down electron (spin $-½$) within a metallic ferromagnetic material so that conduction electrons are spin-polarized and state densities of the spin-up electrons and the spin-down electrons are greatly different from each other. For example, it is known that a ratio of the number of electrons with spin $½$ to the number of electrons with spin $-½$ is about 1:3 in a CoFe alloy. Therefore, when a ferromagnetic layer is formed on a semiconductor layer and electrons or holes are injected into the semiconductor through the ferromagnetic layer, the electrons or the holes having one of the spins are injected into the semiconductor in large quantities so that a spin polarizing state can be established with respect to the conduction electrons or holes in the semiconductor layer.

When light is emitted by utilizing a recombination phenomenon of the electrons and the holes within the semiconductor as in a laser diode, it is known that circularly polarized light is generated when the electrons and the holes have spins in the same direction are recombined with each other. For example, when the electrons with spin $½$ and the holes with spin $½$ are recombined with each other, right-handed circularly polarized light a $\sigma$ is generated. In contrast to this, when the electrons with spin $-½$ and the holes with spin $-½$ are recombined with each other, left-handed circularly polarized light $\sigma-$ is generated.

In the semiconductor laser in accordance with the fourth embodiment of the present invention, a ferromagnetic layer is formed in an n-type contact layer and a ferromagnetic layer is formed on a p-type contact layer, and spin-polarized electrons are injected through one of the ferromagnetic layers and spin-polarized holes are injected through the other ferromagnetic layer. In this case, the right-handed circularly polarized light $\sigma+$ is generated by the recombination phenomenon when magnetization directions of both the ferromagnetic layers are set to be parallel with each other along one direction and the spin-polarized electrons with spin $½$ and the spin-polarized holes with spin $½$ are injected. In contrast to this, the left-handed circularly polarized light $\sigma-$ is generated by the recombination phenomenon when the magnetizing directions of both the ferromagnetic layers are set to be inverted in opposite directions and are set to be parallel with each other in directions reverse to the above case and the spin-polarized electrons of spin $-½$ and the spin-polarized holes with spin $-½$ are injected.

The semiconductor laser in the fourth embodiment of the present invention is preferably constructed such that two ferromagnetic layers are formed on the n-type semiconductor layer and two ferromagnetic layers are formed on the p-type semiconductor layer, and magnetization directions of a pair of ferromagnetic layers vertically opposed to each other are set to be parallel with each other and the magnetization directions of adjacent ferromagnetic layers are inverted to each other in advance. In such a construction, directions of circularly polarized light can be controlled by injecting electrons and holes through any one of the two pairs of ferromagnetic layers. Accordingly, it is possible to provide a semiconductor laser showing high speed circularly polarized light switching characteristics applicable to optical communication by phase shift keying. In the semiconductor laser of the fourth embodiment, linearly polarized light can also be obtained by arranging a polarizer on a light emitting surface. In this embodiment, it is preferable to use a material of a direct transition such as GaAs-based, GaN-based or InP-based material for the semiconductor layer. It is preferable to use an Ni-based, Fe-based or Co-based alloy as a material of the ferromagnetic layer since a large circularly polarized degree can be obtained. Further, it is more preferable to use a half metal for the ferromagnetic layer since a very large circularly polarized degree can obtained.

EXAMPLES

Examples of the present invention will be described.

Example 1

Figure 6:
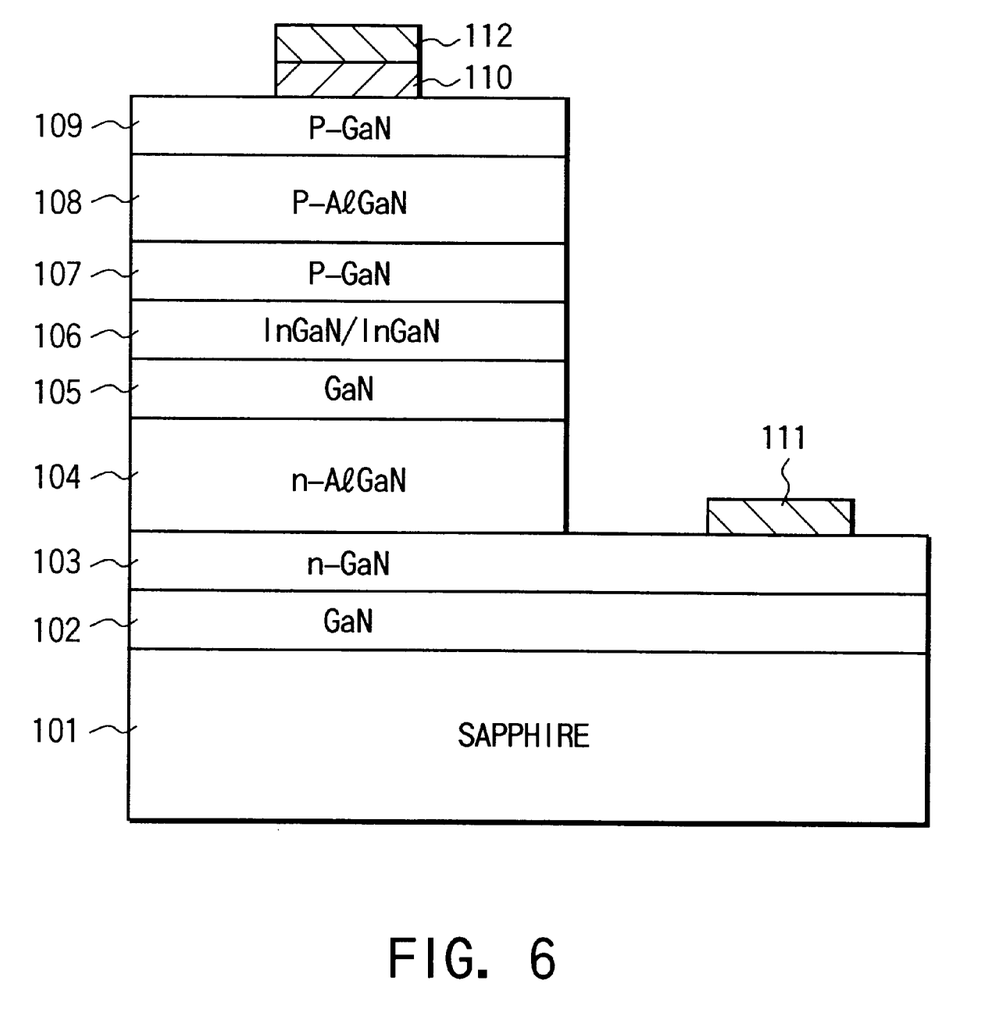
FIG. 6 is a cross-sectional view of a semiconductor laser in the Example 1 of the present invention.

FIG. 6 shows a cross-sectional view of the semiconductor laser in this Example. In FIG. 6, an undoped GaN layer 102, an n-type GaN contact layer 103, an n-type AlGaN cladding layer 104, an undoped GaN optical guide layer 105, a quantum well layer 106 constructed by InGaN/InGaN, a p-type GaN optical guide layer 107, a p-type AlGaN cladding layer 108, and a p-type GaN contact layer 109 are formed in this order on a sapphire substrate 101. Strain of 1% is introduced to the quantum well layer 106. An electric current is confined by forming a mesa structure of 10 µm in width. A CoFe ferromagnetic layer 110 is formed on the p-type GaN contact layer 109. Further, an electrode 111 is formed on the exposed n-type GaN contact layer 103 and an electrode 112 is formed on the CoFe ferromagnetic layer 110.

The threshold current density of this semiconductor laser is 1.5 kA/cm$^2$. This threshold current density is greatly reduced in comparison with 3 kA/cm$^2$ in the conventional semiconductor laser having no ferromagnetic layer.

The threshold current density is reduced to 1 kA/cm$^2$ when the CoFe ferromagnetic layer is also inserted between the n-type GaN contact layer 103 and the n-type AlGaN cladding layer 104 although this CoFe ferromagnetic layer is not illustrated in FIG. 6.

Example 2

Figure 7:
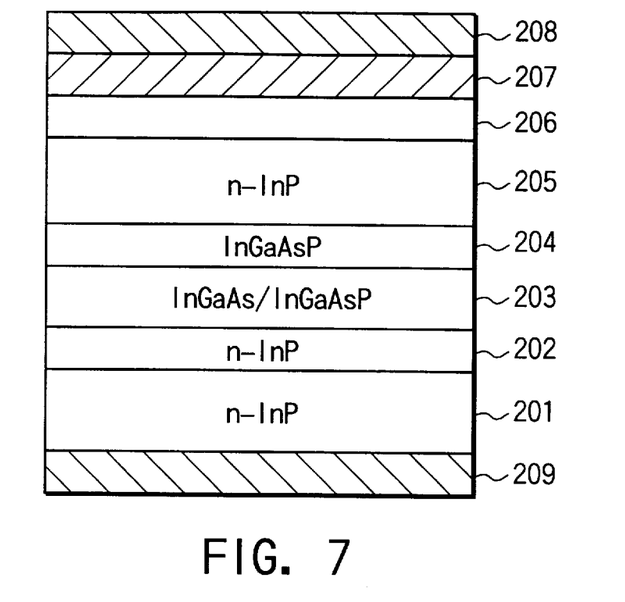
FIG. 7 is a cross-sectional view of a semiconductor laser in the Example 2 of the present invention.

FIG. 7 shows a cross-sectional view of the inter subband transition type semiconductor laser in this Example. In FIG. 7, an n-type InP cladding layer 202, an InGaAs/InGaAsP quantum well layer 203, an InGaAsP waveguide layer 204 and an n-type InP cladding layer 205 are formed in this order on an n-type InP substrate 201. An n-type contact layer 206 and a CoFe ferromagnetic layer 207 are formed on the n-type InP cladding layer 205. Further, an electrode 208 is formed on the CoFe ferromagnetic layer 207 and an electrode 209 is formed on the rear surface of the n-type InP substrate 201.

Although this semiconductor laser has a simple construction, oscillation is obtained at a threshold current density of 5 kA/cm$^2$. No oscillation can be conventionally obtained unless the semiconductor laser has a complicated structure. Accordingly, it is known from this that the threshold value can be greatly reduced in the semiconductor laser of FIG. 7.

Example 3

Figure 8:
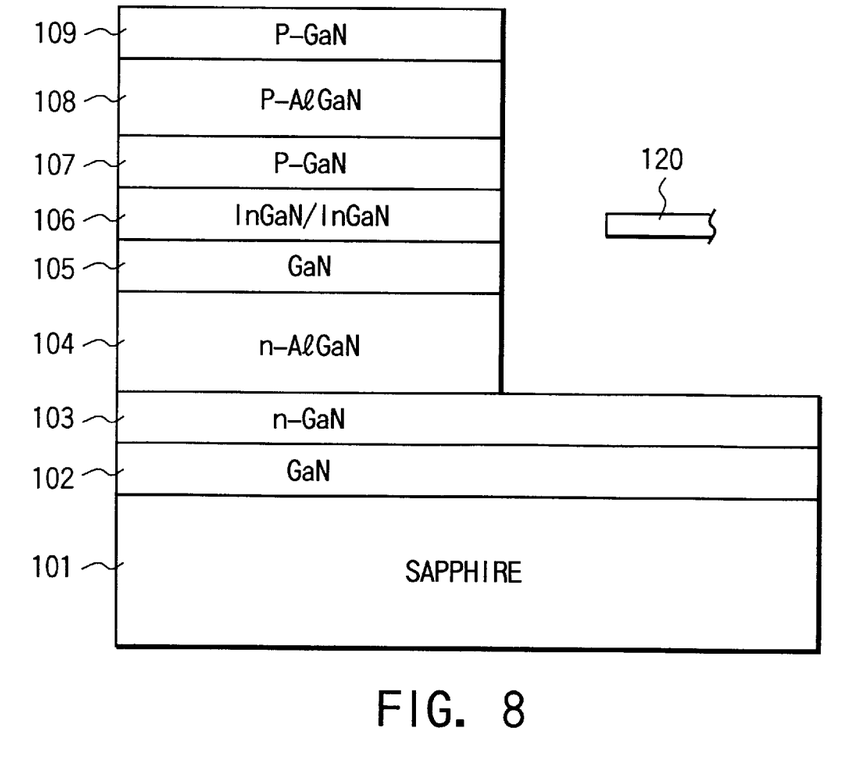
FIG. 8 is a cross-sectional view of the optical bistable element in the Example 3 of the present invention.

FIG. 8 shows a cross-sectional view of the optically pumped bistable semiconductor laser in this Example. This semiconductor laser has a structure similar to that of FIG. 6. Namely, an undoped GaN layer 102, an n-type GaN contact layer 103, an n-type AlGaN cladding layer 104, an undoped GaN optical guide layer 105, a quantum well layer 106 constructed by InGaN/InGaN, a p-type GaN optical guide layer 107, a p-type AlGaN cladding layer 108 and a p-type GaN contact layer 109 are formed in this order on a sapphire substrate 101. Strain of 1% is introduced to the quantum well layer 106. A generated carrier is confined by forming a mesa structure of 10 µm in width. However, this structure differs from that in FIG. 6 in that a magnetic layer and an electrode are not formed on the contact layers.

When circularly polarized pumping light is inputted from a light source 120 to this laser, oscillation is started with a light output corresponding to 3 kA/cm$^2$ in carrier density. The oscillation is maintained even when an output of the pumping light is reduced. The oscillation is stopped when the light output is equal to or smaller than a light output corresponding to 1 kA/cm$^2$ in carrier density. Thus, an optical bistable operation is performed.

Example 4

Figure 9:
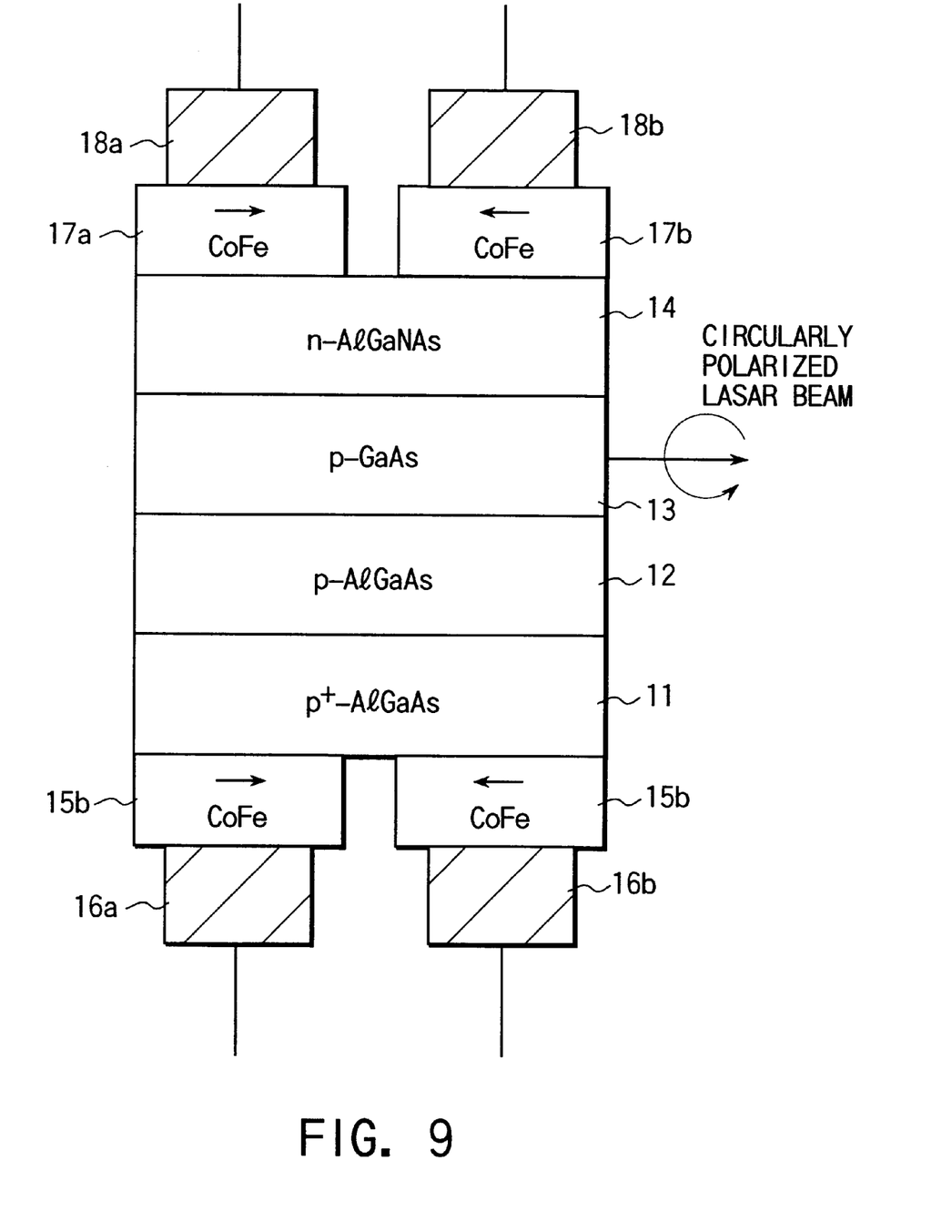
FIG. 9 is a cross-sectional view of a semiconductor laser in the Example 4 of the present invention.

FIG. 9 shows a cross-sectional view of the semiconductor laser in this Example. In FIG. 9, a p-type AlGaAs layer 12, a p-type GaAs layer 13 and an n-type AlGaAs layer 14 are formed in this order on a p$^+$-type AlGaAs substrate 11 so that a laser diode of a double heterojunction structure is constructed. CoFe layers 15a, 15b and electrodes 16a, 16b are formed on the rear surface of the p$^+$-type AlGaAs substrate 11. CoFe layers 17a, 17b and electrodes 18a, 18b are formed on the n-type AlGaAs layer 14.

After this semiconductor laser is fabricated, both magnetization directions of the CoFe layers 15a, 17a constituting a pair in a vertical direction are set to be right-hand direction and both magnetization directions of the CoFe layers 15b, 17b are set to be left-hand direction by treatment in a magnetic field. In this state, electrons with spin ½ are injected into the n-type AlGaAs layer 14 through the CoFe layer 17a magnetized in the right-hand direction from the electrode 18a. Holes with spin ½ are injected into the p$^+$-type AlGaAs substrate 11 through the CoFe layer 15a magnetized in the right-hand direction from the electrode 16a. Thus, recombination is caused in the p-type GaAs layer 13 so that right-handed circularly polarized light is obtained. In contrast to this, electrons with spin -½ are injected into the n-type AlGaAs layer 14 through the CoFe layer 17b magnetized in the left-hand direction from the electrode 18b. Holes with spin -½ are injected into the p$^+$-type AlGaAs substrate 11 through the CoFe layer 15b magnetized in the left-hand direction from the electrode 16b. Thus, recombination is caused in the p-type GaAs layer 13 so that left-handed circularly polarized light is obtained. Accordingly, high speed switching characteristics are obtained by switching the supply of an electric current to the left-hand and right-hand electrode pairs.

Example 5

Figure 10:
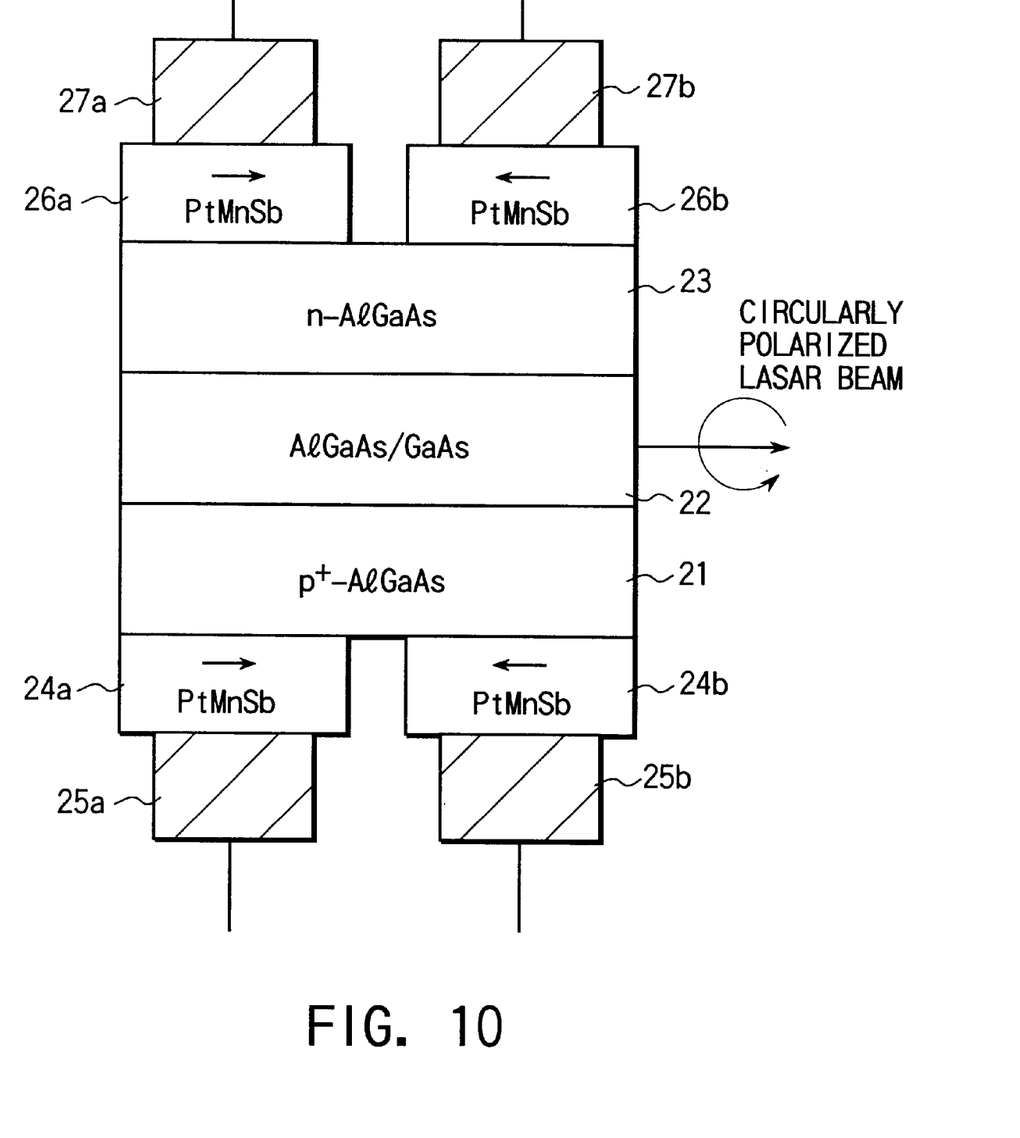
FIG. 10 is a cross-sectional view of a semiconductor laser in the Example 5 of the present invention.

FIG. 10 shows a cross-sectional view of the semiconductor laser in this Example. In FIG. 10, an Al$_{0.2}$Ga$_{0.8}$As/GaAs layer 22 forming a multiple quantum well and an n-type AlGaAs layer 23 are laminated on a p$^+$-type AlGaAs substrate 21 so that a laser diode of a multiple quantum well structure is constructed. PtMnSb layers 24a, 24b as ferromagnetic layers and electrodes 25a, 25b are formed on the rear surface of the p$^+$-type AlGaAs substrate 21. PtMnSb layers 26a, 26b as ferromagnetic layers and electrodes 27a, 27b are formed on the n-type AlGaAs layer 23. This semiconductor laser is processed such that a laser beam is emitted in the right-hand direction in FIG. 10.

After this semiconductor laser is fabricated, both magnetization directions of the PtMnSb layers 24a, 26a constituting a pair in a vertical direction are set to be right-hand direction and both magnetization directions of the PtMnSb layers 24b, 26b are set to be left-hand direction by treatment in a magnetic field. In this state, electrons with spin ½ are injected into the n-type AlGaAs layer 23 through the PtMnSb layer 26a magnetized in the right-hand direction from the electrode 27a. Holes with spin ½ are injected into the p$^+$-type AlGaAs substrate 21 through the PtMnSb layer 24a magnetized in the right-hand direction from the electrode 25a. Thus, recombination is caused in the Al$_{0.8}$Ga$_{0.88}$As/GaAs layer 22 so that right-handed circularly polarized light is obtained. In contrast to this, electrons with spin −½ are injected into the n-type AlGaAs layer 23 through the PtMnSb layer 26b magnetized in the left-hand direction from the electrode 27b. Holes with spin −½ are injected into the p+-type AlGaAs substrate 21 through the PtMnSb layer 24b magnetized in the left-hand direction from the electrode 25b. Thus, recombination is caused in the Al$_{0.2}$Ga$_{0.8}$As/GaAs layer 22 so that left-handed circularly polarized light is obtained. Accordingly, high speed switching characteristics are obtained by switching the supply of an electric current to the left-hand and right-hand electrode pairs.

Note that if the present invention is applied to a surface emitting laser, low threshold value characteristics are obtained and a stable polarizing operation is also obtained.

Example 6

Figure 11:
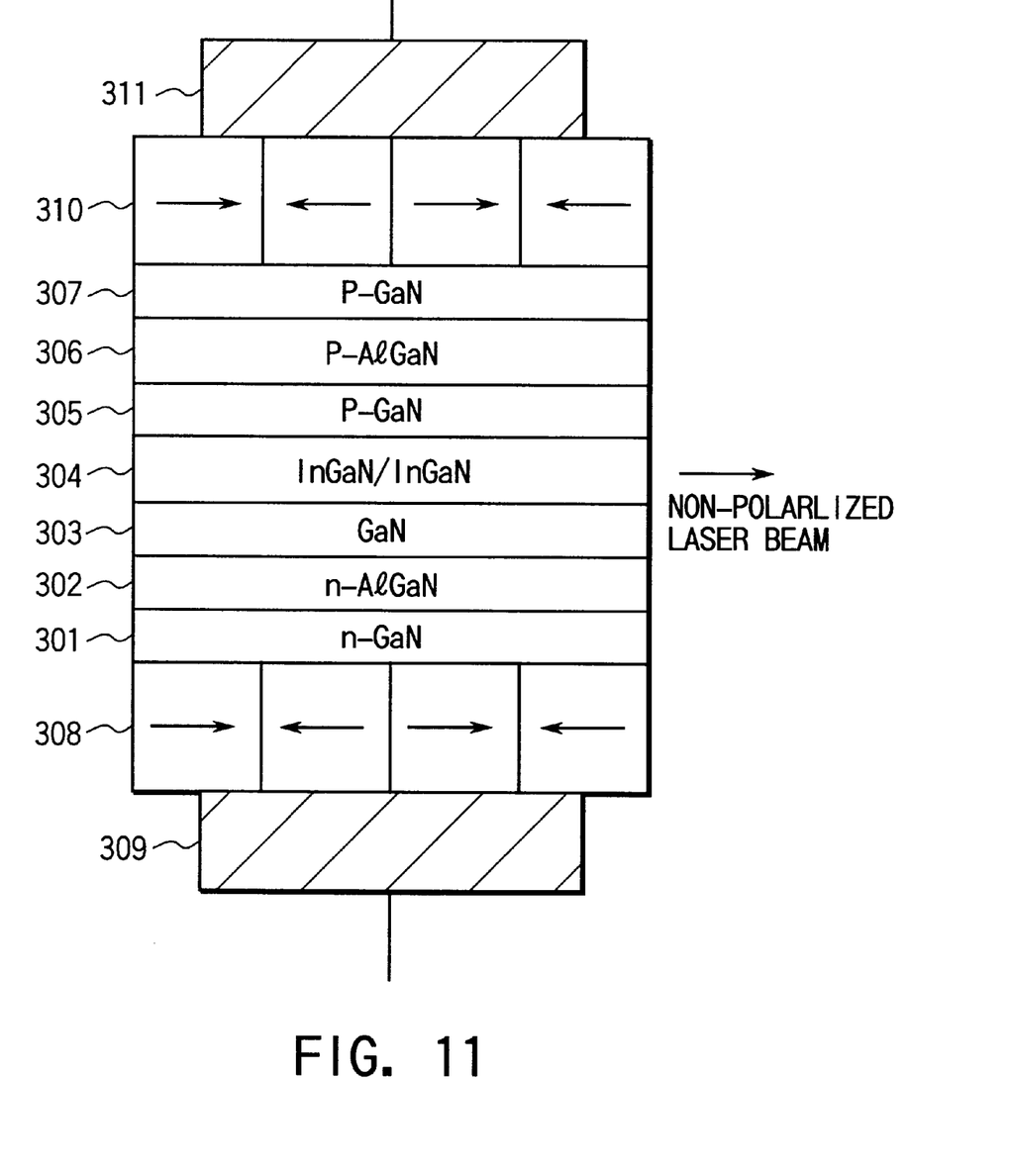
FIG. 11 is a cross-sectional view of a semiconductor laser in the Example 6 of the present invention.

FIG. 11 shows a cross-sectional view of the semiconductor laser in this Example. In FIG. 11, an n-type GaN layer 301, an n-type AlGaN cladding layer 302, an undoped GaN lightguide layer 303, a quantum well layer 304 constructed by InGaN/InGaN, a p-type GaN light guide layer 305, a p-type AlGaN cladding layer 306, and a p-type GaN contact layer 307 are formed sequentially. Strain of 1% is introduced to the quantum well layer 304. A ferromagnetic layer 308, in which magnetic domains are formed, and an electrode 309 are formed on the rear surface of the n-type GaN layer 301. Similarly, a ferromagnetic layer 310, in which magnetic domains are formed, and an electrode 311 are formed on the p-type GaN contact layer 307.

In order to form a domain structure in the ferromagnetic layer, a soft magnetic material such as NiFe, may be used for a ferromagnetic material and magnetic domains spontaneously generated by demagnetizing field due to shape may be used. Alternatively, a material having high coercivity such as CoPt may be used for a ferromagnetic material and magnetic domains may be formed by using a magnetic pole. Alternatively, several separate ferromagnetic layers may be used and respective ferromagnetic layers may be magnetized in different direction.

The threshold current density of this semiconductor laser is 1.5 kA/cm$^2$. This threshold current density is greatly reduced in comparison with 3 kA/cm$^2$ in the conventional semiconductor laser having no ferromagnetic layer. In addition, the semiconductor layer, unlike that of Example 1, can emit non-polarized laser beam because two polarized states are mixed by forming the domain structure in the ferromagnetic layers.

Note that, each of the magnetic domains formed in the ferromagnetic layers 308, 310 are connected as a whole to the electrodes 309, 311. In this case, it is preferable to set the width (the horizontal width in FIG. 11) of each of the magnetic domains to be larger than spin diffusion length to suppress mixing of spins.

What is claimed is:

1. An optical semiconductor device having a structure in which a semiconductor active layer is sandwiched by two cladding layers and a resonator is formed, further comprising:

a unit irradiating said semiconductor active layer with circularly polarized pumping light.

2. An optical semiconductor device having a structure in which a semiconductor active layer is sandwiched by a p-type semiconductor layer and an n-type semiconductor layer, and a p-type contact layer is formed on the p-type semiconductor cladding layer side and an n-type contact layer is formed on the n-type semiconductor cladding layer side, wherein two or more ferromagnetic layers are formed on the p-type contact layer, and two or more ferromagnetic layers are formed on the n-type contact layer.

3. The optical semiconductor device according to claim 2, wherein two ferromagnetic layers are formed on the p-type contact layer and two ferromagnetic layers are formed on the n-type contact layer, and wherein magnetization directions of a pair of ferromagnetic layers vertically opposed to each other are set to be parallel to each other, and magnetization directions of adjacent ferromagnetic layers are inverted to each other.

4. The optical semiconductor device according to claim 2, wherein the semiconductor layers consist of Gaks-based, GaN-based or InP-based semiconductor.

5. The optical semiconductor device according to claim 1, wherein said optical semiconductor device functions as an optical bistable element.

* * * * *